(12) United States Patent
Teboulle

(10) Patent No.: US 10,506,728 B2
(45) Date of Patent: Dec. 10, 2019

(54) HOUSING WITH SECURE OPENING

(71) Applicant: SAGEMCOM ENERGY & TELECOM SAS, Rueil-Malmaison (FR)

(72) Inventor: Henri Teboulle, Rueil-Malmaison (FR)

(73) Assignee: SAGEMCOM ENERGY & TELECOM SAS, Rueil Malmaison (FR)

( * ) Notice: Subject to any disclaimer, the term of this patent is extended or adjusted under 35 U.S.C. 154(b) by 0 days.

(21) Appl. No.: 16/326,123

(22) PCT Filed: Aug. 4, 2017

(86) PCT No.: PCT/EP2017/069862
§ 371 (c)(1),
(2) Date: Feb. 15, 2019

(87) PCT Pub. No.: WO2018/033414
PCT Pub. Date: Feb. 22, 2018

(65) Prior Publication Data
US 2019/0182973 A1    Jun. 13, 2019

(30) Foreign Application Priority Data
Aug. 19, 2016 (FR) .................................. 16 57838

(51) Int. Cl.
*H05K 5/02* (2006.01)
*H01H 9/22* (2006.01)
*H01H 50/20* (2006.01)

(52) U.S. Cl.
CPC ............. *H05K 5/0208* (2013.01); *H01H 9/22* (2013.01); *H01H 50/20* (2013.01)

(58) Field of Classification Search
CPC ........ H05K 5/0208; H01H 9/22; H01H 50/20; D06F 39/14; E05B 61/00; E05B 47/0001
See application file for complete search history.

(56) References Cited

U.S. PATENT DOCUMENTS

| | | | |
|---|---|---|---|
| 4,870,605 A | 9/1989 | Vo | |
| 4,913,984 A * | 4/1990 | Shimizu | G11B 19/04 220/323 |

(Continued)

FOREIGN PATENT DOCUMENTS

FR         2 635 938 A1     3/1990

*Primary Examiner* — Daniel J Rohrhoff
(74) *Attorney, Agent, or Firm* — Muncy Geissler, Olds & Lowe, P.C.

(57) ABSTRACT

A housing including a box that is closed by a cover and a detection device including a pushbutton facing a portion of the cover and a monostable relay having a core that is movable between a withdrawn position into which the core is elastically returned and a deployed position into which the core is driven by a control unit that is arranged to detect the state of the pushbutton, an elastic strip being attached to the end of the core and said portion bearing against the strip when the cover is present and the core is in the deployed position such that the strip is deformed and actuates the pushbutton, the strip and said portion being arranged such that, when the cover is present, said portion holds the core in the deployed position and does not oppose the entry of the core into the deployed position and does not oppose the actuation of the pushbutton by the strip when the core is driven into its deployed position.

3 Claims, 1 Drawing Sheet

(56) References Cited

U.S. PATENT DOCUMENTS

| | | | | |
|---|---|---|---|---|
| 5,682,772 | A | 11/1997 | Hapke et al. | |
| 5,941,374 | A * | 8/1999 | Hapke | D06F 37/42 |
| | | | | 200/345 |
| 9,487,907 | B2 * | 11/2016 | Hapke | D06F 39/14 |
| 2013/0293032 | A1 * | 11/2013 | Promutico | D06F 39/14 |
| | | | | 307/326 |
| 2017/0268256 | A1 * | 9/2017 | Geringer | E05B 47/0012 |

* cited by examiner

HOUSING WITH SECURE OPENING

BACKGROUND OF THE INVENTION

(1) Field of the Invention

The present invention relates to making secure housings that are provided with an electrical power supply. The electrical power supply may comprise means for connecting to an electricity network or a battery that is incorporated in the housing. The housing may be of dimensions that are relatively small, or on the contrary large in order to constitute a cabinet.

(2) Description of Related Art

Housings are known that comprise a box closed by a cover and provided with a detector device for detecting that the cover is present, the housing including an electrical power supply to which the detector device is connected. Conventionally, the detector device comprises a pushbutton connected to a warning unit and actuated by a portion of the cover when the cover is in place on the box. As a function of the shape of the pushbutton, the warning unit can thus determine whether the cover is or is not present, and can thus detect unauthorized opening of the cover. Nevertheless, that assumes that the detector device is powered without interruption: specifically, in the event of an interruption of the power supply, the warning device no longer functions.

BRIEF SUMMARY OF THE INVENTION

An object of the invention is to provide means enabling removal of the cover to be detected in the event of the electrical power supply to the housing being interrupted.

To this end, there is provided a housing comprising a box closed by a cover, a detector device for detecting the presence of the cover, and an electrical power supply to which the detector device is connected. The detector device comprises a pushbutton in register with a portion of the cover, and a monostable relay having a core that is movable between a retracted position towards which the core is urged resiliently, and an extended position towards which the core is driven by a control unit arranged to detect the state of the pushbutton. A spring blade is fastened to the end of the core so as to have a free end that is spaced apart from the pushbutton when the core is in the retracted position and that is in register with the pushbutton when the core is in the extended position. Said portion of the cover comes to press against the blade when the cover is present so that the blade is deformed and actuates the pushbutton, the blade including a portion in relief for co-operating with said portion of the cover. The blade and said portion of the cover are arranged in such a manner that when the cover is in position on the box, said portion of the cover holds the core in the extended position even when the relay is no longer powered and opposes neither the core reaching the extended position nor the pushbutton being actuated by the blade when the core is driven to its extended position from its retracted position.

Thus, when there is an interruption in the power supply and the cover is removed while the power supply is interrupted, the portion of the cover leaves the notch in the spring blade and releases the spring blade and thus the core, which is returned into its retracted position so that the pushbutton is no longer activated. If the cover has not been put back into place when the power supply is restored, the control unit detects that the pushbutton is not activated, thereby reveal-ing that the cover has been opened. The control unit then causes the core to be extended: the spring blade comes into register with the pushbutton but cannot activate the pushbutton so long as the cover has not been put back into place so that the portion of the cover deforms the spring blade. If the cover is put back into place before the power supply is restored, then the control unit detects initially that the pushbutton is not activated, indicating that the cover has been opened, and it drives the core towards its extended position. The spring blade comes into contact with the portion of the cover that deforms the spring blade, thereby causing the pushbutton to be activated. As a result, in the first situation, the control unit detects that the cover is currently absent, and in the second situation the control unit detects that the cover has previously been removed.

Advantageously, the detector device comprises a position sensor for sensing the position of the core, said sensor being connected to the control unit, which is arranged to compare the detected position and the driven position.

The sensor serves to ensure that the relay is operating properly.

Other characteristics and advantages of the invention appear on reading the following description of a particular, non-limiting embodiment of the invention.

BRIEF DESCRIPTION OF THE DRAWINGS

Reference is made to the accompanying drawing, in which.

DETAILED DESCRIPTION OF THE INVENTION

Figure 1:
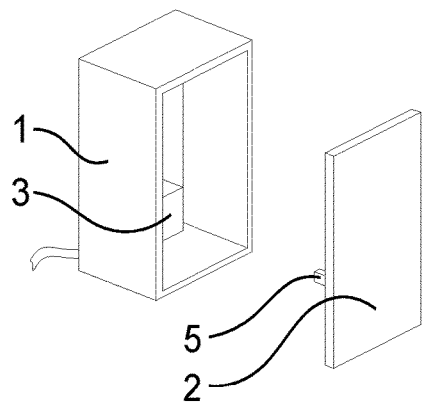
FIG. 1 is a general diagrammatic view in perspective of a housing of the invention.
Figure 2:
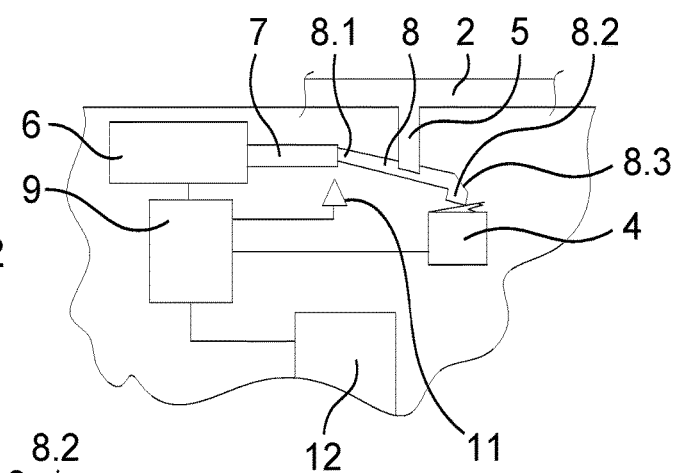
FIG. 2 is a diagrammatic view of the housing surrounding the detector device, with the cover present.
Figure 3:
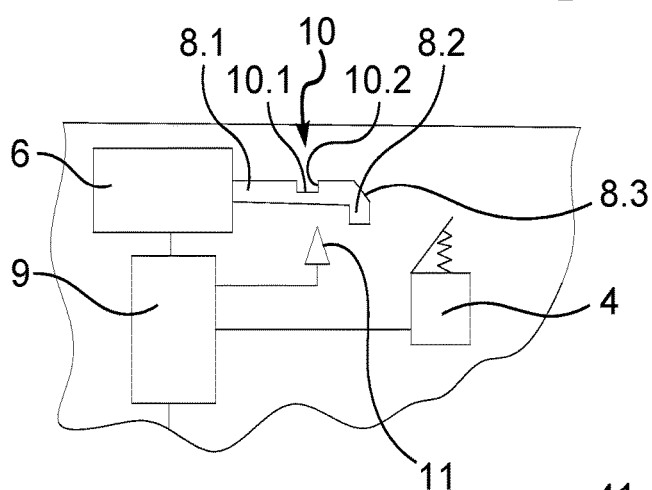
FIG. 3 is a view analogous to FIG. 2, with the cover removed.

With reference to FIGS. 1 to 3, the housing of the invention comprises a box 1 closed by a cover 2, a detector device 3 for detecting the presence of the cover 2, and an electrical power supply 12 to which the detector device 3 is connected. In this example, the cover 2 is removable and it is held in place on the box 1 by a latch that is not shown. The electrical power supply 12, represented in FIG. 1 only by a cable for connection to an electricity power supply network, comprises a conventional transformer unit arranged to transform the electricity of the power supply network into one or more power supplies usable by the components of the housing.

The detector device 3 comprises a pushbutton 4 and a monostable relay 6 having a core 7, with one end 8.1 of a spring blade 8 being fastened to an end of the core and extending the core 7. The pushbutton 4 has a push axis that is parallel to the direction in which the cover 2 is put into place on the box 1.

The core 7 is movable between a retracted position towards which the core 7 is urged resiliently, and an extended position towards which the core 7 is driven by a control unit 9. The spring blade 8 has a free end that is spaced apart from the pushbutton 4 when the core 7 is in the retracted position and that is in register with the pushbutton 4 when the core 7 is in the extended position. The spring blade 8 is elastically deformable in such a manner that when the core 7 is in the extended position, the spring blade 8 has a free end 8.2 remote from its end 8.1 that:

extends over the pushbutton 4 when the spring blade 8 is in the rest state;

pushes down the pushbutton 4 when the spring blade 8 is in a deformed state.

Whether the spring blade 8 is in its rest state or in its deformed state depends on the presence of the cover 2, which possesses a portion 5 that extends between the pushbutton 4 and the free end 8.2 of the spring blade 8 when the core 7 is in the retracted position. When the cover 2 is present and the core 7 is in the extended position, the portion 5 presses against the back of the spring blade 8 and deforms it. The free end 8.2 of the spring blade 8 has a chamfer 8.3 such that when the cover 2 is in place on the box 1 and the core 7 is moved from its retracted position to its extended position, the chamfer 8.3 comes into contact with the portion 5 and slides against said portion 5 so as to deform the spring blade 8, causing its free end 8.2 to push down the pushbutton 4.

The back of the spring blade 8 includes a notch 10 for receiving the end of the portion 5. The notch 10 has a bottom 10.1 against which the end of the portion 5 presses, and beside the free end 8.2 of the spring blade 8, it has a flank 10.2 that forms an angle relative to the bottom 10.1 that is slightly acute and against which a substantially vertical surface of the portion 5 comes to bear, said surface facing away from the monostable relay 6. It can be understood that this arrangement enables the portion 5 to hold the spring blade 8 in an axial direction against the force urging the core 7 to return towards its retracted position: the portion 5 then constitutes retaining means for holding the core 7 in its extended position.

The control unit 9 is also connected to the pushbutton 4 and to the electrical power supply 12. The control unit 9 comprises a processor and a memory for executing a control program and it is arranged to detect the state of the pushbutton 4, to drive the monostable relay 6, and to issue a warning when the cover has been removed. The control unit may include telecommunication means, such as powerline transceiver means or wireless transceiver means, e.g. of the GSM type, in order to send the warning to a warning processor center that might request a technician to be sent on site to verify the installation as a result of detecting that the cover has been opened. The detector device also has a sensor 11 for sensing the position of the core 7, said sensor being connected to the control unit 9.

Thus, when the housing is normally powered, the control unit 9 drives the core 7 into its extended position and uses the position sensor 11 to verify that the core 7 is indeed in its extended position (if not, it issues a failure warning). In the absence of the cover 2, the pushbutton 4 is not pushed in and the control unit 9 detects that the cover 2 is absent and issues a warning accordingly. In the presence of the cover 2, the pushbutton 4 is pushed in and the control unit 9 detects that the cover 2 is present, such that everything is nominal.

When the housing is no longer powered and the cover 2 is not open, the portion 5 holds the spring blade 8 and thus the core 7 in the extended position such that the pushbutton 4 remains pushed in. When power is restored, the control unit 9 detects that the pushbutton 4 is pushed in, such that everything is nominal.

When the housing is no longer powered and the cover 2 is removed while the power supply is interrupted, the portion 5 of the cover 2 leaves the notch 10 in the spring blade 8 and releases the spring blade 8 and thus the core 7, which is then returned into its retracted position.

If the cover 2 has not been put back into place when the power supply is restored, the pushbutton 4 is not pushed in and the control unit 9 detects that the cover 2 is absent and issues a warning accordingly. Thereafter, the control unit 9 causes the core 7 to be extended: the free end 8.2 of the spring blade 8 comes into register with the pushbutton 4, but cannot activate the pushbutton 4 because the cover 2 is absent. The control unit acts via the position sensor 11 to verify whether the core 7 is indeed in its extended position. If the core 7 is confirmed as being in the extended position, then the control unit 9 does not issue a relay failure message. When the cover 2 is put back into place, the portion 5 of the cover 2 presses against the bottom 10.1 of the notch 10 arranged in the back of the spring blade 8 and thus deforms the spring blade 8, which pushes in the pushbutton 4.

If the cover is put back into place before the power supply is restored, then once it is powered again, the control unit 9 detects that the pushbutton 4 is not activated, indicating that the cover 2 has been opened, and it issues a warning that the cover 2 has been opened and then drives the core 7 to its extended position. The chamfer 8.3 of the spring blade 8 comes into contact with the portion 5 of the cover 2, thereby deforming the spring blade 8 and causing the free end 8.2 to bear against the pushbutton 4, and thus to activate the pushbutton 4.

Figure 4:
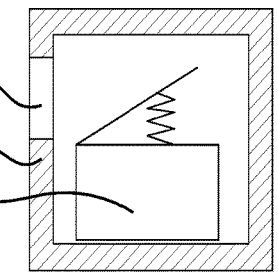
FIG. 4 is a fragmentary diagrammatic view of a housing in a variant of the invention.

In the variant of FIG. 4, the pushbutton 4 is enclosed in a container 40 having an opening 41 of dimensions that are a little greater than the transverse dimensions of the spring blade 8 so as to allow the free end 8.2 of the spring blade 8 to pass through without interfering with it being deformed.

Naturally, the invention is not limited to the embodiment described but covers any variant coming within the ambit of the invention as defined by the claims.

In particular:

although the cover is described as being removable, the cover may be hinged to the box so as to form a door;

although the cover is described as being held in place by a latch, the housing may include other means for fastening the cover on the housing, e.g. screws;

although the detector device is described as having a sensor for sensing the position of the core 7, that sensor is optional;

although the spring blade 8 is described as having a notch 10, it could have a portion in relief that is either set back or else that projects, e.g. a tooth that includes a face that slopes like the chamfer 8.3 and a vertical face having the same function as the flank 10.2;

the deformable blade 8 may be deformable along its entire length, over a portion only thereof, or only where it joins the core 7;

the position detector for detecting retraction of the core 7 is advantageous since it makes it possible to identify a fraud in the event of the control unit detecting simultaneously that the pushbutton 4 is activated and that the core 7 is in the retracted position. Specifically, if a dishonest person blocks the pushbutton in the active state by any means after opening the cover 2, and subsequently closes the cover, while the core is detected by the sensor as being in the retracted position, a warning message is issued indicating an attempt at fraud on the equipment. Specifically, under such circumstances, without the sensor for detecting the anomaly that corresponds to the pushbutton being activated while the core 7 is in the retracted position, it would be believed, wrongly, that everything is nominal;

the power supply may come from the electrical power supply network and/or from an optionally rechargeable battery;

the invention applies by way of example to the housings of electronic equipment, electrical cabinets, . . . .

The invention claimed is:

1. A housing comprising a box closed by a cover, a detector device for detecting the presence of the cover, and an electrical power supply to which the detector device is connected, the housing being characterized in that the detector device comprises a pushbutton in register with a portion of the cover, and a monostable relay having a core that is movable between a retracted position towards which the core is urged resiliently, and an extended position towards which the core is driven by a control unit arranged to detect the state of the pushbutton, a spring blade being fastened to the end of the core so as to have a free end that is spaced apart from the pushbutton when the core is in the retracted position and that is in register with the pushbutton when the core is in the extended position, said portion of the cover coming to press against the blade when the cover is present so that the blade is deformed and actuates the pushbutton, the blade including a portion in relief for co-operating with said portion of the cover, the blade and said portion of the cover being arranged in such a manner that when the cover is in position on the box, said portion of the cover holds the core in the extended position even when the relay is no longer powered and opposes neither the core reaching the extended position nor the pushbutton being actuated by the blade when the core is driven to its extended position from its retracted position.

2. The housing according to claim 1, wherein the detector device comprises a position sensor for sensing the position of the core, said sensor being connected to the control unit which is arranged to compare the detected position and the driven position.

3. The housing according to claim 1, wherein the pushbutton is enclosed in a container including an opening of dimensions that are slightly greater than the transverse dimensions of the spring blade.

* * * * *